United States Patent
Jayashankar et al.

(10) Patent No.: US 9,870,793 B2
(45) Date of Patent: *Jan. 16, 2018

(54) MATERIALS FOR NEAR FIELD TRANSDUCERS AND NEAR FIELD TRANSDUCERS CONTAINING SAME

(71) Applicant: SEAGATE TECHNOLOGY LLC, Cupertino, CA (US)

(72) Inventors: Sethuraman Jayashankar, Excelsior, MN (US); Michael C. Kautzky, Eagan, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/064,977

(22) Filed: Mar. 9, 2016

(65) Prior Publication Data

US 2016/0189735 A1    Jun. 30, 2016

Related U.S. Application Data

(63) Continuation of application No. 14/313,551, filed on Jun. 24, 2014, now Pat. No. 9,286,931.
(Continued)

(51) Int. Cl.
*G11B 13/08* (2006.01)
*G11B 5/31* (2006.01)
(Continued)

(52) U.S. Cl.
CPC ............. *G11B 13/08* (2013.01); *C01F 7/00* (2013.01); *C01G 5/00* (2013.01); *C22C 5/02* (2013.01);
(Continued)

(58) Field of Classification Search
CPC .......... G11B 5/4866; G11B 2005/0021; G11B 5/6088; G11B 2005/001; G11B 7/1387;
(Continued)

(56) References Cited

U.S. PATENT DOCUMENTS

| 4,492,873 A | 1/1985 | Dmitriev |
| 5,482,611 A | 1/1996 | Helmer |

(Continued)

FOREIGN PATENT DOCUMENTS

| EP | 024088 | 10/1987 |
| EP | 0 580 368 A2 | 1/1994 |

(Continued)

OTHER PUBLICATIONS

U.S. Appl. No. 13/923,925, filed Jun. 21, 2013, Pitcher.
(Continued)

*Primary Examiner* — Ali Neyzari
(74) *Attorney, Agent, or Firm* — Mueting, Raasch & Gebhardt, P.A.

(57) ABSTRACT

A method of forming a near field transducer (NFT) layer, the method including depositing a film of a primary element, the film having a film thickness and a film expanse; and implanting at least one secondary element into the primary element, wherein the NFT layer includes the film of the primary element doped with the at least one secondary element.

19 Claims, 2 Drawing Sheets

Related U.S. Application Data

(60) Provisional application No. 61/838,405, filed on Jun. 24, 2013, provisional application No. 61/838,393, filed on Jun. 24, 2013, provisional application No. 61/897,303, filed on Oct. 30, 2013, provisional application No. 61/838,398, filed on Jun. 24, 2013, provisional application No. 61/838,626, filed on Jun. 24, 2013, provisional application No. 61/984,915, filed on Apr. 28, 2014.

(51) Int. Cl.

| | | |
|---|---|---|
| *G11B 7/1387* | (2012.01) | |
| *G11B 7/24059* | (2013.01) | |
| *C22C 5/02* | (2006.01) | |
| *C22C 5/06* | (2006.01) | |
| *C22C 9/02* | (2006.01) | |
| *C22C 9/08* | (2006.01) | |
| *C22C 11/04* | (2006.01) | |
| *C22C 13/00* | (2006.01) | |
| *C22C 18/02* | (2006.01) | |
| *C22C 19/03* | (2006.01) | |
| *C22C 20/00* | (2006.01) | |
| *C22C 21/00* | (2006.01) | |
| *C22C 21/02* | (2006.01) | |
| *C22C 21/10* | (2006.01) | |
| *C22C 22/00* | (2006.01) | |
| *C22C 27/00* | (2006.01) | |
| *C22C 27/02* | (2006.01) | |
| *C22C 27/06* | (2006.01) | |
| *C22C 38/06* | (2006.01) | |
| *G11B 5/48* | (2006.01) | |
| *C01F 7/00* | (2006.01) | |
| *C01G 5/00* | (2006.01) | |
| *G11B 5/60* | (2006.01) | |
| *C23C 14/58* | (2006.01) | |
| *C22C 5/04* | (2006.01) | |
| *C22C 5/10* | (2006.01) | |
| *C22C 9/00* | (2006.01) | |
| *C22C 9/04* | (2006.01) | |
| *C22C 9/05* | (2006.01) | |
| *C22C 9/06* | (2006.01) | |
| *C22C 9/10* | (2006.01) | |
| *C22C 19/07* | (2006.01) | |
| *C22C 21/06* | (2006.01) | |
| *C22C 24/00* | (2006.01) | |
| *C22C 28/00* | (2006.01) | |
| *C22C 30/02* | (2006.01) | |
| *G11B 5/00* | (2006.01) | |
| *B32B 15/01* | (2006.01) | |

(52) U.S. Cl.
CPC ............... *C22C 5/06* (2013.01); *C22C 9/02* (2013.01); *C22C 9/08* (2013.01); *C22C 11/04* (2013.01); *C22C 13/00* (2013.01); *C22C 18/02* (2013.01); *C22C 19/03* (2013.01); *C22C 20/00* (2013.01); *C22C 21/00* (2013.01); *C22C 21/003* (2013.01); *C22C 21/02* (2013.01); *C22C 21/10* (2013.01); *C22C 22/00* (2013.01); *C22C 27/00* (2013.01); *C22C 27/02* (2013.01); *C22C 27/025* (2013.01); *C22C 27/06* (2013.01); *C22C 38/06* (2013.01); *C23C 14/5833* (2013.01); *G11B 5/314* (2013.01); *G11B 5/3106* (2013.01); *G11B 5/3163* (2013.01); *G11B 5/4866* (2013.01); *G11B 5/6088* (2013.01); *G11B 7/1387* (2013.01); *G11B 7/24059* (2013.01); *B32B 15/01* (2013.01); *B32B 15/018* (2013.01); *C22C 5/04* (2013.01); *C22C 5/10* (2013.01); *C22C 9/00* (2013.01); *C22C 9/04* (2013.01); *C22C 9/05* (2013.01); *C22C 9/06* (2013.01); *C22C 9/10* (2013.01); *C22C 19/07* (2013.01); *C22C 21/06* (2013.01); *C22C 24/00* (2013.01); *C22C 28/00* (2013.01); *C22C 30/02* (2013.01); *G11B 2005/0021* (2013.01)

(58) Field of Classification Search
CPC ............... G11B 5/3116; G11B 13/045; G11B 11/10554; G11B 11/1058; G11B 5/3133; G11B 5/3163; G11B 5/3106; G11B 13/08; G11B 7/1384; G11B 7/1206; G11B 5/314; G11B 7/24059; C22C 5/02; C22C 5/06; C22C 9/08; C22C 11/04
USPC ...................................................... 369/13.33
See application file for complete search history.

(56) References Cited

U.S. PATENT DOCUMENTS

| | | |
|---|---|---|
| 5,849,093 A | 12/1998 | Andra |
| 5,945,681 A | 8/1999 | Tokiguchi |
| 6,130,436 A | 10/2000 | Renau |
| 6,144,098 A | 11/2000 | Iyer |
| 6,589,676 B1 | 7/2003 | Gui |
| 6,632,483 B1 | 10/2003 | Callegari |
| 6,641,932 B1 | 11/2003 | Xu |
| 6,683,426 B1 | 1/2004 | Kleeven |
| 7,018,729 B2 | 3/2006 | Pocker |
| 7,377,228 B2 | 5/2008 | Mack |
| 7,476,855 B2 | 1/2009 | Huang |
| 8,040,761 B2 | 10/2011 | Kawamori |
| 8,351,151 B2 | 1/2013 | Katine |
| 8,400,902 B2 | 3/2013 | Huang |
| 8,427,925 B2 | 4/2013 | Zhao |
| 8,514,673 B1* | 8/2013 | Zhao ............... G11B 5/3133 369/13.33 |
| 8,830,800 B1 | 9/2014 | Pitcher |
| 8,934,198 B2 | 1/2015 | Zou |
| 8,945,731 B2 | 2/2015 | Zhao |
| 9,286,931 B2* | 3/2016 | Jayashankar ......... G11B 5/314 |
| 9,570,098 B2* | 2/2017 | Jayashankar ......... G11B 5/3163 |
| 2005/0012052 A1 | 1/2005 | Platzgummer |
| 2006/0238133 A1 | 10/2006 | Horsky |
| 2008/0230724 A1 | 9/2008 | Low |
| 2010/0123965 A1 | 5/2010 | Lee |
| 2010/0123967 A1 | 5/2010 | Batra |
| 2010/0190036 A1 | 7/2010 | Komvopoulos |
| 2010/0320403 A1 | 12/2010 | Amaldi |
| 2010/0329085 A1 | 12/2010 | Kawamori |
| 2011/0006214 A1 | 1/2011 | Bonig |
| 2011/0026161 A1 | 2/2011 | Ikeda |
| 2011/0096431 A1 | 4/2011 | Hellwig |
| 2011/0205863 A1 | 8/2011 | Zhao |
| 2013/0161505 A1 | 6/2013 | Pitcher |
| 2013/0164453 A1 | 6/2013 | Pitcher |
| 2013/0164454 A1 | 6/2013 | Pitcher |
| 2013/0288077 A1 | 10/2013 | Dhawam |
| 2014/0004384 A1 | 1/2014 | Zhao |
| 2014/0113160 A1 | 4/2014 | Pitcher |
| 2014/0376341 A1 | 12/2014 | Wessel |
| 2014/0376342 A1 | 12/2014 | Wessel |
| 2015/0132503 A1 | 5/2015 | Kautzky |
| 2015/0162028 A1 | 6/2015 | Jayashankar |
| 2015/0162030 A1 | 6/2015 | Jayashankar |

FOREIGN PATENT DOCUMENTS

| | | |
|---|---|---|
| EP | 0942072 | 9/1999 |
| EP | 1328027 | 7/2003 |
| EP | 2106678 | 10/2008 |
| WO | WO 97/45834 | 12/1997 |

(56) References Cited

FOREIGN PATENT DOCUMENTS

WO     WO 2013/163195     10/2013
WO     WO 2013/163470     10/2013

OTHER PUBLICATIONS

U.S. Appl. No. 14/062,651, filed Oct. 24, 2013, Zou.
Al-Bayati et al., Junction Profiles of Sub keV Ion Implantation for Deep Sub-Quarter Micron Devices, *IEEE,* 2000, pp. 87-90.
Angel et al., "Enhanced Low Energy Drift-Mode Beam Currents in a High Current Ion Implanter," *IEEE,* 1999, pp. 219-222.
Druz et al., "Diamond-Like Carbon Films Deposited Using a Broad, Uniform Ion Beam from an RF Inductively Coupled CH4-Plasma Source", Diamond and Related Materials, vol. 7, No. 7, Jul. 1998, pp. 965-972.
Liu et al., "Influence of the Incident Angle of Energetic Carbon Ions on the Properties of Tetrahedral Amorphous Carbon (ta-C) films", *Journal of Vacuum Science and Technology,* vol. 21, No. 5, Jul. 25, 2003, pp. 1665-1670.

Metallization: "Metallization; chapter 5", In: *Kris v. Srikrishnan and Geraldine C. Schwartz:* "Handbook of Semiconductor Interconnection Technology, Second Edition", 2006, CRC Press, Boca Raton, FL, USA, XP002711255, ISBN:978-1-4200-1765-6, pp. 311-382, Section 5.4.1.2 Adhesion; p. 320.
Piazza et al., "Large Area Deposition of Hydrogenated Amorphous Carbon Films for Optical Storage Disks", Diamond and Related Materials, vol. 13, No. 4-8, Apr. 2004, pp. 1505-1510.
Robertson, J., "Diamond-Like Amorphous Carbon," *Materials Science and Engineering R 37,* 2002, pp. 129-281.
Satoh et al., "Evaluation of Adhesion Materials for Gold Line-and-Space Surface Plasmon Antenna on SO1-MOS Photodiode", Silicon Nanoelectronics Workshop (SNW), 2010, *IEEE,* Piscataway, NJ, USA, Jun. 13, 2010, pp. 1-2.
Vogt, K.W. et al., "Characterization of Thin Titanium Oxide Adhesion Layers on Gold Resistivity, Morphology, and Composition", *Surface Science,* North-Holland, Amsterdam, NL, vol. 301, No. 1-3, Jan. 10, 1994, pp. 203-213.

\* cited by examiner

MATERIALS FOR NEAR FIELD TRANSDUCERS AND NEAR FIELD TRANSDUCERS CONTAINING SAME

PRIORITY

This application is a continuation of U.S. application Ser. No. 14/313,551, filed Jun. 24, 2014, which claims priority to U.S. Provisional Application Nos. 61/838,405 entitled "NEAR FIELD TRANSDUCER MATERIALS" filed on Jun. 24, 2013, 61/838,393 entitled "MATERIALS FOR NEAR FIELD TRANSDUCERS AND NEAR FIELD TRANSDUCERS INCLUDING THE SAME" filed on Jun. 24, 2013, 61/897,303 entitled "MATERIALS FOR NEAR FIELD TRANSDUCERS AND NEAR FIELD TRANSDUCERS INCLUDING THE SAME" filed on Oct. 30, 2013, 61/838,398 entitled "NEAR FIELD TRANSDUCERS AND METHODS OF FORMING THE SAME" filed on Jun. 24, 2013, 61/838,626 entitled "NEAR FIELD TRANSDUCERS AND METHODS OF FORMING THE SAME" filed on Jun. 24, 2013, and 61/984,915 entitled "METHODS OF FORMING NEAR FIELD TRANSDUCERS (NFTS) USING ION IMPLANTATION" filed on Apr. 28, 2014, the disclosure of which is incorporated herein by reference thereto.

SUMMARY

A method of forming a near field transducer (NFT) layer, the method including depositing a film of a primary element, the film having a film thickness and a film expanse; and implanting at least one secondary element into the primary element, wherein the NFT layer includes the film of the primary element doped with the at least one secondary element.

A method of forming a peg of a near field transducer (NFT), the method including depositing a primary element to form a primary element film or layer; defining a peg of the NFT from the primary element film or layer; forming the peg of the NFT; encapsulating the peg with an encapsulation layer; defining an implant; and implanting at least one secondary element in the implant area of the primary element film to form the peg of the NFT.

A method of forming a plurality of magnetic heads, each of the magnetic heads including an alloyed peg of a NFT, the method including depositing a primary element on a substrate to form a primary element film or layer; forming a plurality of pegs of the NFTs; slicing the substrate into rows, each row containing a plurality of pegs; depositing head overcoat material on each row; and implanting at least one secondary element in the primary element film of the peg to form an alloyed peg of a NFT.

The above summary of the present disclosure is not intended to describe each disclosed embodiment or every implementation of the present disclosure. The description that follows more particularly exemplifies illustrative embodiments. In several places throughout the application, guidance is provided through lists of examples, which examples can be used in various combinations. In each instance, the recited list serves only as a representative group and should not be interpreted as an exclusive list.

BRIEF DESCRIPTION OF THE FIGURES

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Heat assisted magnetic recording (referred to through as HAMR) utilizes radiation, for example from a laser, to heat media to a temperature above its curie temperature, enabling magnetic recording. In order to deliver the radiation, e.g., a laser beam, to a small area (on the order of 20 to 50 nm for example) of the medium, a NFT is utilized. During a magnetic recording operation, the NFT absorbs energy from a laser and focuses it to a very small area; this can cause the temperature of the NFT to increase. The temperature of the NFT can be elevated up to about 400° C. or more.

The very high temperatures that the NFT reaches during operation can lead to diffusion of the material of the NFT (for example gold) from the peg and towards the disk. In addition, a portion of the NFT may be exposed at the air bearing surface of the recording head and is thus subject to mechanical wearing. NFT performance is greatly influenced by the heat and mechanical stress during HAMR operation. It would therefore be advantageous to have NFT devices that are more durable.

Disclosed devices can offer the advantage of providing more efficient transfer of energy from an energy source to the magnetic storage media to be heated, a smaller focal point at the point of heating, or some combination thereof. In some embodiments, disclosed devices can be used within other devices or systems, such as magnetic recording heads, more specifically, thermally or heat assisted magnetic recording (HAMR) heads, or disc drives that include such devices.

Figure 1:
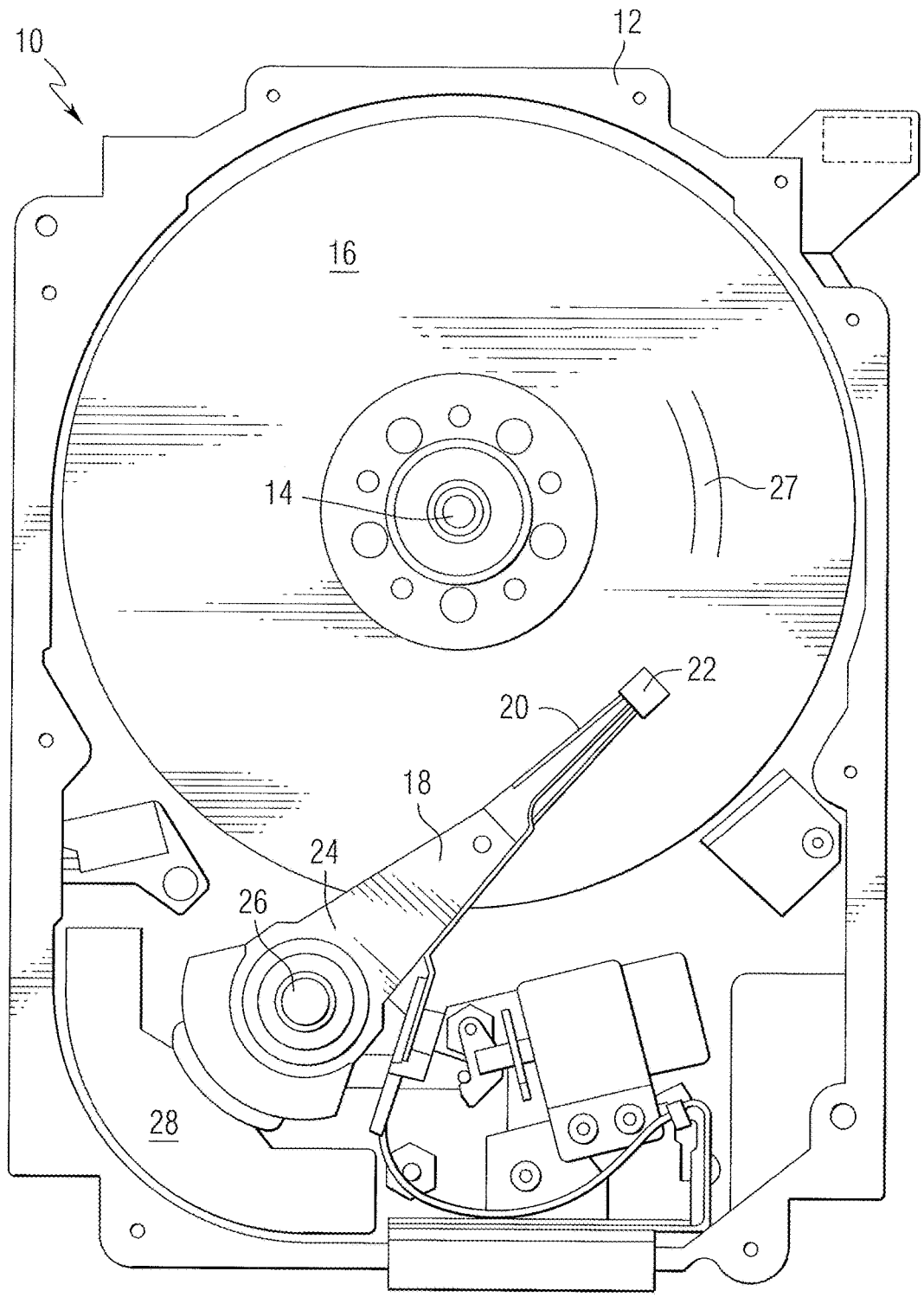
FIG. 1 is a pictorial representation of a data storage device in the form of a disc drive that can include a recording head constructed in accordance with an aspect of this disclosure.

Disclosed herein are NFTs and devices that include such NFTs. FIG. 1 is a pictorial representation of a data storage device in the form of a disc drive 10 that can utilize disclosed NFTs. The disc drive 10 includes a housing 12 (with the upper portion removed and the lower portion visible in this view) sized and configured to contain the various components of the disc drive. The disc drive 10 includes a spindle motor 14 for rotating at least one magnetic storage media 16 within the housing. At least one arm 18 is contained within the housing 12, with each arm 18 having a first end 20 with a recording head or slider 22, and a second end 24 pivotally mounted on a shaft by a bearing 26. An actuator motor 28 is located at the arm's second end 24 for pivoting the arm 18 to position the recording head 22 over a desired sector or track 27 of the disc 16. The actuator motor 28 is regulated by a controller, which is not shown in this view and is well-known in the art. The storage media may include, for example, continuous media or bit patterned media.

For heat assisted magnetic recording (HAMR), electromagnetic radiation, for example, visible, infrared or ultraviolet light is directed onto a surface of the data storage media to raise the temperature of a localized area of the media to facilitate switching of the magnetization of the area. Recent designs of HAMR recording heads include a thin film waveguide on a slider to guide light toward the storage media and a near field transducer to focus the light to a spot size smaller than the diffraction limit. While FIG. 1 shows a disc drive, disclosed NFTs can be utilized in other devices that include a near field transducer.

Figure 2:
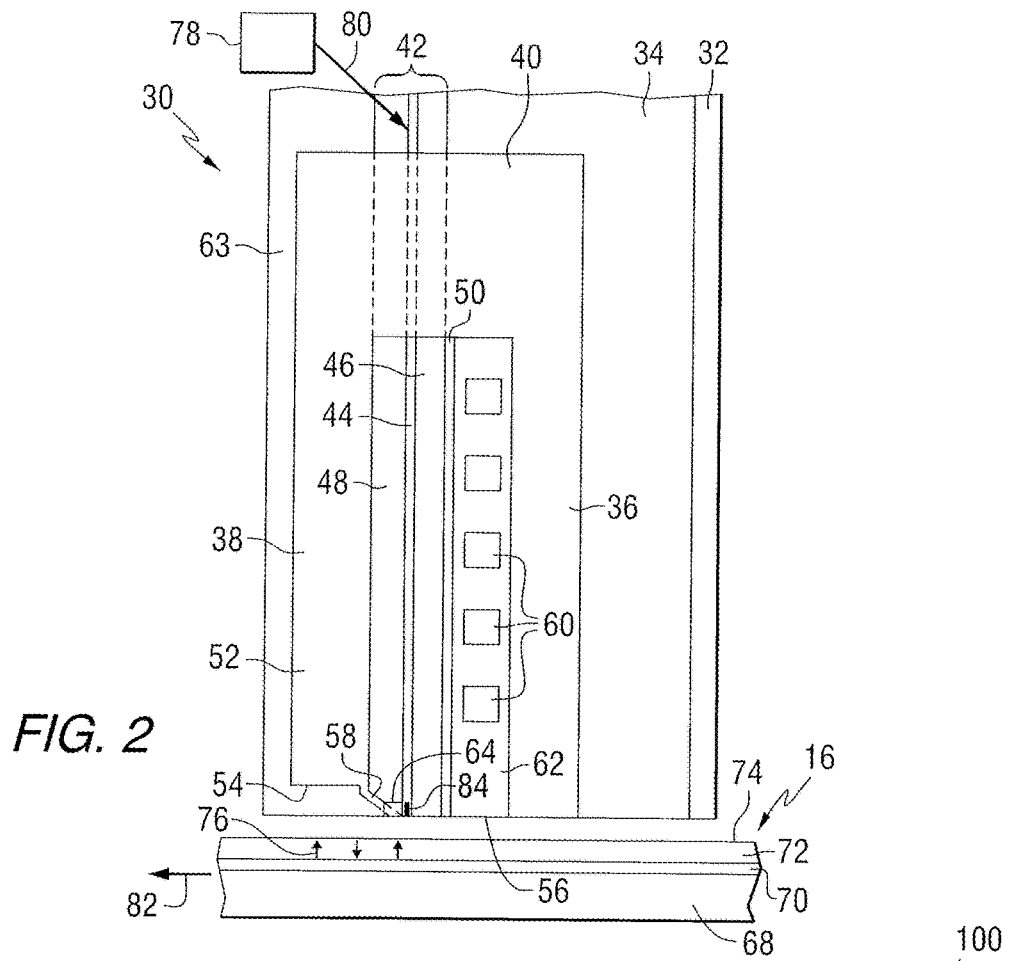
FIG. 2 is a side elevation view of a recording head constructed in accordance with an aspect of the invention.

FIG. 2 is a side elevation view of a recording head that may include a disclosed NFT; the recording head is positioned near a storage media. The recording head 30 includes a substrate 32, a base coat 34 on the substrate, a bottom pole 36 on the base coat, and a top pole 38 that is magnetically coupled to the bottom pole through a yoke or pedestal 40. A waveguide 42 is positioned between the top and bottom poles. The waveguide includes a core layer 44 and cladding layers 46 and 48 on opposite sides of the core layer. A mirror 50 is positioned adjacent to one of the cladding layers. The top pole is a two-piece pole that includes a first portion, or pole body 52, having a first end 54 that is spaced from the air bearing surface 56, and a second portion, or sloped pole piece 58, extending from the first portion and tilted in a direction toward the bottom pole. The second portion is structured to include an end adjacent to the air bearing surface 56 of the recording head, with the end being closer to the waveguide than the first portion of the top pole. A planar coil 60 also extends between the top and bottom poles and around the pedestal. In this example, the top pole serves as a write pole and the bottom pole serves as a return pole.

An insulating material 62 separates the coil turns. In one example, the substrate can be AlTiC, the core layer can be $Ta_2O_5$, and the cladding layers (and other insulating layers) can be $Al_2O_3$. A top layer of insulating material 63 can be formed on the top pole. A heat sink 64 is positioned adjacent to the sloped pole piece 58. The heat sink can be comprised of a non-magnetic material, such as for example Au.

As illustrated in FIG. 2, the recording head 30 includes a structure for heating the magnetic storage media 16 proximate to where the write pole 58 applies the magnetic write field H to the storage media 16. In this example, the media 16 includes a substrate 68, a heat sink layer 70, a magnetic recording layer 72, and a protective layer 74. However, other types of media, such as bit patterned media can be used. A magnetic field H produced by current in the coil 60 is used to control the direction of magnetization of bits 76 in the recording layer of the media.

The storage media 16 is positioned adjacent to or under the recording head 30. The waveguide 42 conducts light from a source 78 of electromagnetic radiation, which may be, for example, ultraviolet, infrared, or visible light. The source may be, for example, a laser diode, or other suitable laser light source for directing a light beam 80 toward the waveguide 42. Specific exemplary types of light sources 78 can include, for example laser diodes, light emitting diodes (LEDs), edge emitting laser diodes (EELs), vertical cavity surface emitting lasers (VCSELs), and surface emitting diodes. In some embodiments, the light source can produce energy having a wavelength of 830 nm, for example. Various techniques that are known for coupling the light beam 80 into the waveguide 42 may be used. Once the light beam 80 is coupled into the waveguide 42, the light propagates through the waveguide 42 toward a truncated end of the waveguide 42 that is formed adjacent the air bearing surface (ABS) of the recording head 30. Light exits the end of the waveguide and heats a portion of the media, as the media moves relative to the recording head as shown by arrow 82. A near-field transducer (NFT) 84 is positioned in or adjacent to the waveguide and at or near the air bearing surface. The heat sink material may be chosen such that it does not interfere with the resonance of the NFT.

Although the example of FIG. 2 shows a perpendicular magnetic recording head and a perpendicular magnetic storage media, it will be appreciated that the disclosure may also be used in conjunction with other types of recording heads and/or storage media where it may be desirable to concentrate light to a small spot.

Figure 3:
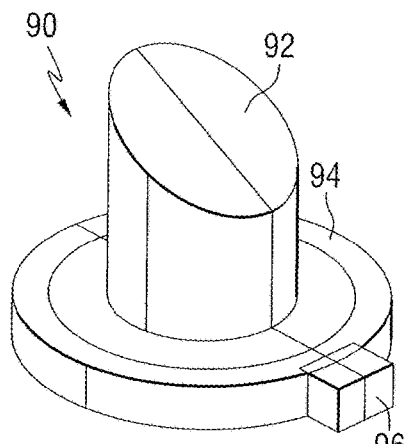
FIG. 3 is a schematic representation of a near field transducer.

FIG. 3 is a schematic view of a lollypop NFT 90 in combination with a heat sink 92. The NFT includes a disk shaped portion 94 and a peg 96 extending from the disk shaped portion. The heat sink 92 can be positioned between the disk shaped portion and the sloped portion of the top pole in FIG. 2. When mounted in a recording head, the peg may be exposed at the ABS and thus can be subjected to mechanical wearing.

Figure 4:
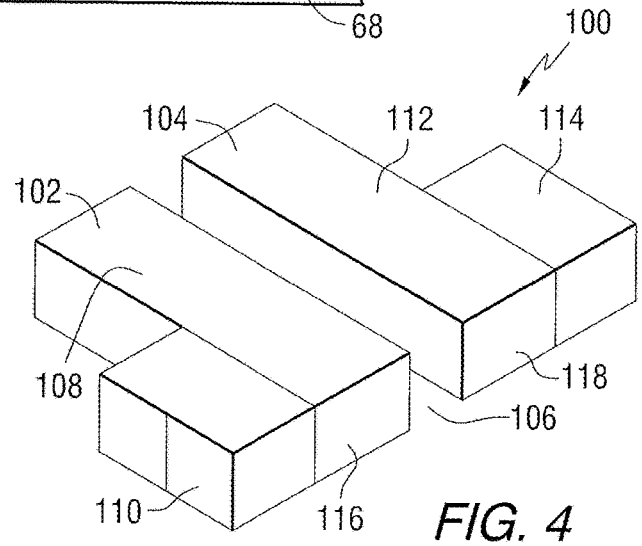
FIG. 4 is a schematic representation of another near field transducer.

FIG. 4 is a schematic view of a coupled nanorod (CNR) NFT 100. This NFT includes two nanorods 102 and 104 separated by a gap 106. Nanorod 102 includes a first portion 108 and a second portion 110. Nanorod 104 includes a first portion 112 and a second portion 114. When mounted in a recording head, the ends 116 and 118 of the nanorods may be exposed at the ABS and thus be subject to mechanical wearing. FIGS. 3 and 4 show example NFTs. However, the disclosure is not limited to any particular type of NFT. The materials described below may be used in various NFT configurations.

Disclosed herein are methods of forming NFTs that include a primary element and at least one secondary element. Primary elements may include, gold (Au), silver (Ag), copper (Cu), aluminum (Al), or combinations thereof, for example. In some embodiments, the secondary atom can include those disclosed in U.S. Pat. No. 8,427,925, U.S. Patent Publication Number 20140050057, U.S. patent application Ser. No. 13/923,925 entitled MAGNETIC DEVICES INCLUDING FILM STRUCTURES, U.S. Patent Application filed on the same day herewith having Ser. No. 14/313, 651 entitled MATERIALS FOR NEAR FIELD TRANSDUCERS AND NEAR FIELD TRANSDUCERS CONTAINING SAME, U.S. Patent Application filed on the same day herewith having Ser. No. 14/313,528 entitled MATERIALS FOR NEAR FIELD TRANSDUCERS AND NEAR FIELD TRANSDUCERS CONTAINING SAME, and U.S. Patent Application filed on the same day herewith having Ser. No. 14/313,717 entitled MATERIALS FOR NEAR FIELD TRANSDUCERS AND NEAR FIELD TRANSDUCERS CONTAINING SAME, the entire disclosures of which are all incorporated herein by reference thereto.

In some embodiments, the at least one secondary atom can be boron (B), bismuth (Bi), indium (In), sulfur (S), silicon (Si), tin (Sn), manganese (Mn), tellurium (Te), holmium (Ho), lutetium (Lu), praseodymium (Pr), scandium (Sc), uranium (U), barium (Ba), chlorine (Cl), cesium (Cs), dysprosium (Dy), europium (Eu), fluorine (F), germanium (Ge), hydrogen (H), iodine (I), rubidium (Rb), selenium (Se), terbium (Tb), cesium (Cs), carbon (C), antimony (Sb), gadolinium (Gd), samarium (Sm), thallium (Tl), hafnium (Hf), niobium (Nb), manganese (Mn), erbium (Er), zinc (Zn), nitrogen (N), oxygen (O), osmium (Os), phosphorus (P), rhenium (Re), beryllium (Be), yttrium (Y), sodium (Na), strontium (Sr), thulium (Tm), promethium (Pm), lanthanum (La), cerium (Ce), cobalt (Co), nickel (Ni), neodymium (Nd), ytterbium (Yb), lead (Pb), magnesium (Mg), calcium (Ca), iron (Fe), molybdenum (Mo), zirconium (Zr), chromium (Cr), gallium (Ga), potassium (K), lithium (Li), rhodium (Rh), vanadium (V), titanium (Ti), tantalum (Ta), platinum (Pt), thorium (Th), cadmium (Cd), palladium (Pd), technetium (Tc), ruthenium (Ru), tungsten (W), mercury (Hg), or combinations thereof for example. In some embodiments a secondary atom can include silver (Ag), copper (Cu), aluminum (Al), or gold (Au) in combination with a primary atom that is not the same, e.g., a NFT could include gold as the primary atom and silver as the secondary atom, but a NFT could not include gold as the primary atom and gold as the secondary atom. One or more than one secondary atom can be utilized. Useful amounts of secondary elements can be introduced into a primary element film with relatively modest penalties to the plasmonic properties, optical properties, thermal properties, or combinations thereof.

In some embodiments, a primary element can include silver (Ag), copper (Cu), or aluminum (Al). In some embodiments where the primary element is silver (Ag) at least one secondary element can be selected from: sodium (Na), thallium (Tl), bismuth (Bi), lead (Pb), potassium (K), cesium (Cs), rubidium (Rb), beryllium (Be), boron (B), manganese (Mn), or combinations thereof for example. In some embodiments where the primary element is silver (Ag) at least one secondary element can be selected from: sodium (Na), strontium (Sr), calcium (Ca), boron (B), scandium (Sc), carbon (C), beryllium (Be), yttrium (Y), thorium (Th), antimony (Sb), lead (Pb), tin (Sn), thallium (Tl), lutetium (Lu), thulium (Tm), erbium (Er), holmium (Ho), ytterbium (Yb), gadolinium (Gd), samarium (Sm), promethium (Pm), praseodymium (Pr), sulfur (S), neodymium (Nd), phosphorus (P), cerium (Ce), lanthanum (La), iron (Fe), nitrogen (N), oxygen (O), molybdenum (Mo), and combinations thereof. In some embodiments where the primary element is silver (Ag) at least one secondary element can be selected from: cobalt (Co), nickel (Ni), copper (Cu), zirconium (Zr), magnesium (Mg), or combinations thereof for example. In some embodiments where the primary element is silver (Ag) at least one secondary element can be selected from: gold (Au), palladium (Pd), platinum (Pt), aluminum (Al), or some combination thereof. In some embodiments where the primary element is copper (Cu) at least one secondary element can be selected from: cadmium (Cd), mercury (Hg), indium (In), antimony (Sb), sodium (Na), thallium (Tl), potassium (K), cesium (Cs), rubidium (Rb), bismuth (Bi), lead (Pb), tin (Sn), or combinations thereof. In some embodiments where the primary element is copper (Cu) at least silver (Ag) can be included as a secondary element. In some embodiments where the primary element is aluminum (Al) at least one secondary element can be selected from: boron (B), beryllium (Be), antimony (Sb), tin (Sn), mercury (Hg), indium (In), lead (Pb), bismuth (Bi), thallium (Tl), sodium (Na), potassium (K), rubidium (Rb), cesium (Cs), or combinations thereof.

Disclosed herein are numerous methods of forming a NFT having a primary element and at least one secondary element. Generally, the various types of methods disclosed herein include depositing or co-depositing the primary and secondary element(s) from a target(s); incorporating the secondary element(s) into the NFT by diffusion from a seed layer; utilizing surface carburization, boronization, or nitridation; by ion implantation; or combinations thereof.

Deposition

Disclosed methods can utilize deposition from a target material. Deposition can be accomplished using a target that includes both the primary and secondary element or it can be accomplished using separate targets, one of which includes the primary element and the other including the secondary element. An annealing step can be undertaken after the primary and secondary elements are deposited. The annealing step can be designed to drive the secondary element from the interior of the grain to the grain boundary. The annealing step providing better properties to the NFT material can be advantageous because the entire device may require an annealing step. Annealing conditions, such as temperature and time would be known to one of skill in the art, having read this specification.

Diffusion from Seed Layer

A NFT that includes a primary element and at least one secondary element may also be formed by forming a seed layer that includes the secondary element(s) and then driving some of that material into the already deposited primary element material. Diffusion of some of the secondary element from the seed layer to the primary element in the NFT (or NFT precursor) can be accomplished through annealing. Annealing conditions, such as temperature and time would be known to one of skill in the art, having read this specification.

Carburizing/Boronizing/Nitriding

A NFT that includes a primary element and at least one secondary element may also be formed by exposing a NFT (or NFT precursor) made of the primary element to heat treatment in an atmosphere that contains the secondary element. Such processes can be utilized by, for example vaporizing the secondary element in the presence of the NFT (or NFT precursor) in an elevated temperature environment. Such processes can also be referred to, in some instances as carburizing (where carbon is the secondary element), nitriding (where nitrogen is the secondary element), boronizing or boriding (where boron is the secondary element), or carbonitriding (where both carbon and nitrogen are the secondary elements) for example.

Ion Implantation

One of the potential issues with conventional sputtering techniques when sputtering alloy films (including a primary element and at least one secondary element) is the possibility of the secondary element(s) segregating and separating to the grain boundary during the deposition process. The problem can be exacerbated at lower film thicknesses or low dopant or alloying element concentrations, where the secondary element could diffuse out to the surface of the film. Lighter secondary elements have higher mobility and are therefore prone to higher diffusion. This could result in deviations of the composition of the NFT from a targeted composition. Formation of a NFT (or precursor) using ion implantation can alleviate such problems.

In some embodiments specific ion implantation methods that can be utilized can include beam line implants, or plasma immersion implants for example. The ion beam used for implanting secondary element(s) can be from a beam line producing a pure or skewed Gaussian profile, or a plasma ion immersion system forming an error function dopant profile. Implantation of the secondary element(s) can be carried out at elevated temperature or at cryogenic or cold temperature.

Any of the disclosed methods can be carried out on planar surfaces, on sloped or contoured surfaces, on surfaces with retrograde wall angles, or any combination thereof. Although formation of NFT elements are specifically contemplated and discussed herein, it will be understood by one of skill in the art that disclosed methods can also be utilized in the formation of heat sink elements, for example, as well.

In some embodiments, the secondary element could have a substantially constant concentration across the NFT (or NFT precursor) or could have a concentration that changes. The profile of the secondary element(s), which can also be referred to as the dopant in the context of an ion implantation process through the thickness of the film could be Gaussian, or could be an error function dopant distribution for example. In some embodiments, the secondary element could be implanted at the same energy throughout the primary element or could be implanted at different energies at different portions of the film. The energy of implantation can control, at least in part, the depth at which the secondary element is implanted in the film of the primary element. The energy for the implantation could be a single energy, or it could be a combination of energies for example. In embodiments where more than one energy is utilized, the profiles of each could additively be used to shape and tailor the final profile (e.g., the depth profile) of the secondary element in the film.

In addition to through thickness tailoring of the composition profile, the composition could alternatively (or in combination) be spatially varied across the breadth or expanse of the film (e.g., the wafer diameter). For example, the center of the wafer could have a first composition profile while the edge of the wafer could have a second and different composition profile. In some embodiments more than one secondary element could be implanted in a primary element film, each optionally having a chosen through thickness and across wafer composition profile. The sequence in which the secondary elements are implanted can be chosen such that the diffusivity and the crystallinity of the film can be advantageously affected.

The concentration of the secondary element can be varied from several 10 s of ppm to several atomic percent. In some embodiments, the secondary element can have a concentration that is not less than 10 ppm (or 0.001 atomic percent, at %), or in some embodiments not less than 100 ppm (0.01 at %). In some embodiments, the secondary element can have a concentration that is not greater than 10 at %, or in some embodiments not greater than 5 at %. The concentration of the secondary element can be controlled (e.g., metered in real time) using electrical methods, for example. Because control can be accomplished using electrical control, precise and repeatable control should be relatively easy to obtain.

In some embodiments, an optional post anneal thermal treatment could be used to further shape the dopant profile in the NFT. In some embodiments, another optional step can be carried out before the optional annealing step, e.g., a metal or dielectric cap layer can be deposited on the NFT film surface. In some embodiments, multiple thermal treatments, multiple implantation steps, or combinations thereof can be carried out.

NFTs produced using implantation methods can offer advantages (over co-deposition methods, for example) because secondary elements introduced via ion implantation generally remain in the lattice due to the physics of the implantation process. Specifically, implantation processes are not constrained by thermodynamic equilibrium or stoichiometry and therefore separation or segregation of the secondary element is not likely to occur.

Disclosed methods can also include another step after the implantation step, where the NFT layer (made up of the primary element film implanted with the at least one secondary element) is patterned into a NFT. The step of patterning can include one or more than one step and can utilize known patterning processes including, for example photolithography, etching, etc.

In some embodiments secondary elements may be incorporated into a primary element layer that is covered or at least partially encapsulated with a dielectric or metal layer. As described above, one of the potential concerns when incorporating dopants (e.g., secondary elements) at low levels in NFT films is grain boundary and surface segregation of the dopant atoms, especially lighter atoms as well as those with limited solubility in the primary element film lattice. Surface oxidation of the secondary element could also lead to depletion of the secondary element from the interior of the film. Thermal exposure of the NFT film after the alloying or film formation step could therefore lead to deviations in composition from a targeted composition.

To mitigate these effects, the implantation of the at least one secondary element into the primary element film can be carried out after a protective metal or dielectric layer is deposited on the primary element film. The protective metal or dielectric layer can be referred to as an encapsulate layer. The encapsulant layer seals off the surface of the primary element film from the exterior atmosphere thereby suppressing loss of the implanted secondary element to the atmosphere during and after processing. Use of an encapsulant layer can be especially advantageous when implanting in relatively thin films or with secondary elements that have mobility or segregation tendencies. Use of an oxide encapsulant layer may also help the film layer maintain planarity during subsequent thermal annealing steps by preventing or minimizing possible thermal grooving of the grain boundaries.

The encapsulant layer can include metals or dielectric materials. Illustrative dielectric materials can include dielectric oxides such as alumina, silica, yttria, zirconia, tantala, titania, niobia, or combinations thereof, for example. The encapsulant layer can also include a metal or an alloy of a metal. In some embodiments, a material for an encapsulant layer can be selected based on its compatibility with further processing that will be carried out on the article (e.g., wafer or rowbar processing). In some embodiments, the material can be a material that will be part of the larger device, or it should be one that can be removed (in some embodiments relatively easily removed) subsequent to implantation.

The encapsulant layer can have a thickness that is not less than 2 nm, or in some embodiments not less than 5 nm. In some embodiments, the encapsulant layer can have a thickness that is not greater than 100 nm, or in some embodiments not greater than 30 nm. In some embodiments, part of the encapsulant layer is consumed during the implantation process due to sputtering of the surface atoms. As such, the encapsulant layer thickness may be dynamically varied to intentionally shift the position of "Rp" and "delta Rp" (Rp is the statistical mean depth from the sample/film surface where the peak dopant concentration would occur; and delta Rp refers to the sigma or the spread of the dopant concentration profile across the thickness of the implanted film). The progressive shifting of the peak profile position 'Rp" during the implant process can be advantageously used to control the dopant localization and mixing. Sometimes, while carrying out the implantation of an NFT or heat sink element through the encapsulant oxide, the constituent element of the oxide can also preferentially get knocked into the NFT or heat sink film during implant. The extent of this encapsulant film knock in in the underlying film can be controlled by controlling the encapsulant oxide thickness as well as the implanted dose.

In some embodiments, more than one secondary element can be implanted through the encapsulant layer, each with its own (same or different) implantation parameters. In some embodiments, the ion beam can be directed at a normal angle (90 degree) to the wafer or sample surface, or it can be incident at an angle ranging anywhere from 1 degree to 90 degrees, relative to the wafer or sample surface. In some embodiments, the sample can be stationary during the implantation, or it can be rotated at a fixed or variable rate of speed during implanting.

Implantation with or without an encapsulation layer can be carried out at various stages of processing and formation of NFTs (or other elements). In some embodiments secondary elements may be incorporated into a film or layer of the primary element through ion implantation before the film or layer is formed into a NFT, or at a stage where the air bearing surface (ABS) of the NFT (and surrounding device) is being defined. Regardless of the timing of when the implantation is being done, the implantation can be done globally into the surface or it can be carried out in conjunction with a mask that allows only selected areas of the surface to be implanted.

Ion implantation being undertaken during ABS definition can be done at various stages, including for example at rough lap, at final lap, after the first layer of head overcoat has been deposited, or after the entire layer of head overcoat has been deposited. In some embodiments, a Gaussian dopant profile can be implanted at rough lap, followed by a final lap, whose final thickness can be set to advantageously coincide with the 'Rp" of the implanted Gaussian distribution. In some embodiments, the ABS surface can be subject to plasma immersion ion implantation, with the error function like distribution of the secondary element leading away from the ABS.

In some embodiments, more than one secondary element, each with its own energy and dose profile can be implanted into the ABS rowbar, for example. Such implantation could be carried out to improve the performance of the NFT element, to advantageously modify the properties of the head overcoat, or both. The implantation can also be done to advantageously modify the corrosion resistance of the write pole material. Implantation carried out after the deposition of a partial or full head overcoat may serve to "lock" the secondary element inside the active device structure (write pole or NFT), thereby serving to improve its efficacy.

Implantation at an ABS processing stage can also optionally be combined with sequential oxidation processes to form thin metal oxides for protection purposes.

The methods discussed above can be utilized to produce different types of implanted NFT layers (or NFTs). Illustrative examples of such can include interfacial mixing and localization of the implanted species at interfaces and graded interfaces, for example.

In some embodiments, secondary element(s) can be implanted so as to be preferentially located at the dielectric-metal interface. The dielectric-metal interfaces (e.g., dielectric-NFT interfaces and dielectric-heat sink interface) being referred to herein can include the core to NFT space/NFT interface (referred to herein as the CNS/NFT interface), the NFT to pole space/NFT interface (referred to herein as the NPS/NFT interface), or the NFT to pole space/heat sink interface (referred to herein as the NPS/Heat Sink interface). Preferential placement of the secondary element(s) within a few nanometers of such interfaces can lead to intentional mixing or rearrangement of the atoms at the interface due to primary atomic collisions as well as recoil collisions arising from the implanted atom. This may lead to advantageous interfacial stabilization.

It is thought, but not relied upon that if the secondary element(s) is not located within a few nanometers of the NFT/dielectric interface, the presence of excess dopant atoms in the NFT may diminish or even eliminate the plasmonic properties of the NFT material, or contribute to excessively high optical propagation losses in the dielectric material. Secondary element(s) chosen may be chosen so as to minimize the straggle or the lateral spread at the interface. Parameters such as the atomic weight, the incidence angle of implantation, the dose and the incident beam energy, or combinations thereof can be chosen so as to control the interfacial localization. Advantage can be taken of the steepness of the dopant profile gradient to place the interfacial mixing layer so as to minimize and control the dopant spread into the NFT layer to within a few nanometers. For the case of beam implants, the position of the "Rp" parameter and the "delta Rp" parameter can be carefully controlled so as to achieve the desired interfacial mixing.

In some embodiments, more than one secondary element(s) can be preferentially located at one or more interfaces. Subsequent to the implant step, the secondary elements can be appropriately activated so as to react with each other, or with the dielectric or metal layer, to form an intermediary layer that may aid in bonding of the dielectric layer to the metal NFT element.

The tilt angle used when implanting to impart interfacial mixing can depend, at least in part, on the device geometry (planar vs. contoured 3D structures, etc.) as well as other considerations. Larger tilt angles may lead to better mixing, but at the expense of larger secondary element path length through the encapsulant layer. Therefore a smaller fraction of the dopant would localize at the interface, leading to an overall decrease in the implant efficiency.

In some embodiments, implantation of a secondary element(s) may be utilized to form a graded interface or graded implantation. A graded implantation may be advantageous in controlling the film stresses, thermal stresses, CTE stresses, optical properties, or some combination thereof. One method of forming a graded implantation can include first depositing a primary element layer having a thickness that is less than the final desired thickness. In some embodiments, such a layer can have a thickness from 0.1 nm to 20 nm, and may be deposited on top of the CNS layer (for example). Next, the secondary element(s) can be implanted into the primary element layer. In such embodiments, the secondary element(s) can be one that may serve to advantageously improve the film densification, enhance the interfacial strength of the interface on which it is deposited, or a combination thereof (e.g., the CNS/NFT interface). Such a species may have mutual affinity for the NFT film and the dielectric material (e.g., the CNS material). An example of such a secondary element can include sulfur (S), which may preferentially bond to the gold. Such implantation processes and primary element layer deposition processes can be carried out alternatively in a repeated sequence, thereby forming a layered or a graded structure.

In some embodiments, more than one secondary element can be utilized. In such embodiments, the at least two secondary elements may react with each other, or one or more of them may react with the dielectric material surface, one or more of them may react with the primary element film during the growth process to improve the density and the interfacial strength, or some combination thereof. In a particular illustrative embodiment, gold deposition as the primary element layer may be combined with co-implantation of one or more secondary elements, followed by subsequent deposition and implantation sequences to form a relatively more dense and compacted NFT structure.

It should be understood, having read this specification, that the process of interface strengthening and initial film densification as described herein, while applicable to NFT materials such as Au, Ag, Al, Cu, etc., are also equally applicable to the formation of interconnect processes in semiconductor manufacturing. It should also be understood that such modifications can be used advantageously in the manufacture of trench liners, via liners, etc. that can be subsequently used for write pole processing, damascene copper processes, etc. Use of such methods may lead to advantageous gains in electromigration resistance, reliability, or other such properties for example.

Methods disclosed herein may form NFTs that offer advantageous properties based on various mechanistic reasoning. The NFT grain and interface boundary can be atomically engineered by the preferential adsorption of secondary atom(s) in order to pin the grain boundary and improve the grain boundary migration resistance of a NFT that includes, a primary atoms, such as gold for example. This can also be described as utilizing minor alloying elements (e.g., secondary atom(s)) to alter the fundamental grain boundary migration kinetics of the primary atom (e.g., gold). Mechanical high temperature reliability of the NFT may therefore be improved by intentional microalloying additions of one or more secondary atom(s) into the NFT material. Such intentional alloying can pin the grain boundary movement by the so called "solute drag" effect, making it harder for the peg to recess.

Disclosed concepts may provide stable NFT element dimensions during operating temperatures by pinning grain growth. This concept utilizes the preferential placement of secondary atoms at the grain boundaries of the NFT material to pin grain movement. The secondary atoms are chosen such that the total strain energy and total chemical potential energy of the system of atoms is reduced when they are at the grain boundary. Thus the grain boundary secondary atom is in a potential "well" and therefore "locks" the movement of the grain boundary.

The preferential placement of secondary atoms can be accomplished by facilitating the movement of secondary atoms to the grain boundaries. Such secondary atoms may be able to stabilize the NFT against grain growth through the following mechanisms: increased drag force on the moving grain boundary due to the binding chemical potential and elastic strain interaction of secondary atom to the grain boundary; reduction of grain boundary diffusion by poisoning of the primary atom (e.g., gold) grain boundary by the tightly adsorbed secondary atoms blocking of the diffusion jump sites at the boundary by the secondary atoms; reduction of the efficiency of secondary atom transfer across the grain boundary by the secondary atom; change in the grain boundary structure brought about by the secondary atom; preferential formation of vacancy-secondary atom pairs and secondary atom-primary atom pairs at the grain boundary which make boundary migration harder; improving the grain boundary cohesion; or some combination thereof.

It should be understood, having read this disclosure, that grain boundaries as discussed herein include high angle and low angle grain boundaries, coherent and incoherent boundaries, tilt and twist boundaries, intergranular phases as well as high symmetry boundaries such as twin boundaries.

An important consequence of these considerations is that NFTs without secondary atom(s) will have higher grain boundary mobilities and lower stabilities. Thus NFTs as typically formulated will have lower resistance to grain boundary movement since, by definition, they do not have secondary atoms in the system that can preferentially locate to the grain boundary. They will therefore possess undesirable grain migration and reliability performance.

In contrast, disclosed NFTs can utilize a secondary atom(s) to pin the grain boundary. A secondary atom(s) present even at a few 10 s or 100 s of ppm may make a dramatic impact in curtailing the mobility of the grain boundaries. Secondary atom(s) which reduce the strain energy and chemical potential at the grain boundary may lead to preferential clustering of secondary atoms near the grain boundaries (called Cottrell atmospheres) which may provide locking mechanisms that impede grain boundary movement. It should be emphasized that the primary function of the secondary atom(s) is grain boundary mobility impairment, although other functions such as solid solution strengthening are also possible.

A secondary atom can be chosen based, at least in part, on the ability for preferential segregation of the secondary atom (solute atom) to the grain boundary. The secondary atom(s) preferentially bond to the grain boundary because of the lowering of the energy at the grain boundary. The choice of solute atom is thus governed by the Grain Boundary Segregation energy, which is the lowering of the system energy due to reduction of the elastic misfit strain energy and the electronic (valence) interaction energy. The choice of secondary atoms can be aided by the use of DFT computations, as well as electronegativity and atomic elastic strain field energy calculations.

Faster secondary atoms may lead to better pinning of the grain boundary. It is also understood that a combination of more than one secondary atom may lead to better pinning of the grain boundary due to efficient boundary interstitial site filling (space-fill efficiency) due to the combination of varying secondary atom atomic radii. This is analogous to achieving better space filling when a mixture of different sized balls is used rather than a single sized ball.

A possible advantage of utilizing the solute drag method of grain boundary stabilization is that very low concentrations of secondary atoms, compared to solid solution strengthening or precipitation hardening, is needed. This in turn minimizes the impact of the modification on the plasmonic properties. Larger grain sizes possess smaller grain boundary area, and therefore require lower amounts of solute phase to percolate the boundary. In fact, only several hundred ppm of secondary atom (dopant) concentration may produce a 3 to 4 order of magnitude change in the grain boundary mobility. Initially the grain boundaries are pinned to the secondary atom atmospheres thereby immobilizing them. As the temperature is raised, the secondary atoms gain vibrational energy. The boundary then has an increasing tendency to decouple from the solute atoms pinning it. At a certain temperature, the boundary breaks away from the secondary atoms surrounding it. The breakaway temperature of the grain boundary is related to the concentration of secondary atoms at the boundary. Higher secondary atom concentrations at the boundary lead to higher break away temperatures.

In some embodiments disclosed NFTs can be made using alternate methods of doping interstitial atoms or solute atoms. In some embodiments electron beam heating of a NFT film can lead to carbon incorporation. In some embodiments the deposition of a metal layer (or carbon or boron for example) followed by a diffusion anneal can be utilized. In some embodiments, surface nitridization or surface carburization of a deposited NFT film can be utilized to incorporate nitrogen or carbon. In some embodiments, a dopant atom(s) can be incorporated into the seed layer and then driven by diffusion into the NFT material.

Also disclosed herein are methods that can be referred to as self implantation of a NFT film, for example gold (Au) with the same material (e.g., Au). Such self implantation can serve to improve the film density. The knock-in of the Au atoms (for example) into the underlying CNS layer for instance may not only serve to densify the gold, but it may also improve the interfacial adhesion by providing anchor points in the dielectric for the gold. Self implantation may have the advantage that virtually unlimited doses of dopant can be applied without concern for the optical penalty of the dopant material to the NFT. In the same fashion, other NFT materials such as Ag, Cu, Al can also be densified and modified by self implantation with the appropriate species.

Self implantation can also be applied after the NPS deposition. In this case, the Au atoms (for example) deposited through the NPS can be made to preferentially localize and strengthen the top Au/NPS interface.

While the present disclosure is not so limited, an appreciation of various aspects of the disclosure will be gained through a discussion of the examples provided below.

EXAMPLES

An illustrative process flow for carrying out a disclosed method can include the following: deposition of a primary element (e.g., a plasmonic material such as gold (Au), silver (Ag), copper (Cu), aluminum (Al), or a combination thereof) to form a primary element film or layer; definition of the peg of a NFT from the primary element film or layer using patterning methods such as photolithography for example; formation of the peg of a NFT using removal methods such as etching, etc.; encapsulation of the peg with a dielectric material; definition of an implant area using a mask; and implantation of a secondary element(s) in the implant area of the primary element film. In some embodiments, an optional heat treatment step can be carried out after the step of implanting the secondary element(s). In some embodiments, an optional step of removing at least part of the encapsulating dielectric material can be undertaken after implantation of the secondary element(s) (or optionally after the optional heat treatment). This can help control the interfacial and optical properties of the encapsulant film. If at least part of the encapsulating dielectric material was removed, another optional step may be added to redeposit some additional dielectric material (either the same dielectric material or a different dielectric material).

Another illustrative process flow for carrying out a disclosed method can include the following: deposition of a primary element (e.g., a plasmonic material such as gold (Au), silver (Ag), copper (Cu), aluminum (Al), or a combination thereof) to form a primary element film or layer; implantation of a secondary element(s) in the primary element film to form a NFT layer; definition of the peg of a NFT from the NFT layer using patterning methods such as photolithography for example; formation of the peg of a NFT using removal methods such as etching, etc. In some embodiments, an optional step of deposition of a dielectric material on the primary element film or layer can be carried out before the secondary element(s) is implanted. In some embodiments, an optional heat treatment step can be carried out after the step of implanting the secondary element(s). In some embodiments, an optional step of removing at least part of the encapsulating dielectric material can be undertaken after implantation of the secondary element(s) (or optionally after the optional heat treatment). This can function to remove dielectric material that may have secondary element(s) implanted therein. If at least part of the encapsulating dielectric material was removed, another optional step may be added to redeposit some additional dielectric material (either the same dielectric material or a different dielectric material) once the peg is formed.

Another illustrative process flow for carrying out a disclosed method can include the following: deposition of a primary element (e.g., a plasmonic material such as gold (Au), silver (Ag), copper (Cu), aluminum (Al), or a combination thereof) to form a primary element film or layer on a substrate that can contain other layers, structures, or both; definition of a plurality of pegs of NFTs from the primary element layer using patterning methods such as photolithography for example; formation of the plurality of pegs of the NFTs using removal methods such as etching, etc.; formation of a plurality of entire magnetic recording heads containing the pegs of the NFTs on the substrate; slicing the substrate into rows, each row containing a plurality of magnetic recording heads; forming at least a portion of an overcoat on the row; and implantation of a secondary element(s) in at least the peg regions of the primary element film to form alloyed NFTs. In some embodiments, an additional portion of the overcoat layer can be deposited after implantation of the at least one secondary element. In some embodiments a portion of the overcoat material may be advantageously removed and re-deposited to control the integrity and film stress of the head overcoat.

Ion implantation was carried out on a 25 nm sheet of film of NFT material. The NFT material can be deposited on top of the CNS and appropriate seed material. Illustrative specific implantation parameters can include the following. For carbon (C), an implant voltage of 6 keV, a dose of 1E14 ions/cm2 and 1E15 ions/cm2, and a wafer tilt angle of 0 degrees. For nitrogen (N), an implant voltage of 7.2 keV, a dose of 1E14 ions/cms and 1E15 ions/cm2, and a wafer tilt angle of 0 degrees. Following ion implantation the NFT film was patterned and formed into a NFT peg.

Ion implantation was carried out on a patterned NFT peg and heat sink which were encapsulated with 10 nm AlOx. Illustrative specific implantation parameters can include the following. For carbon (C), an implant voltage of 15 keV, a dose of 1E14 ions/cm2 and 1E15 ions/cm2, and a wafer tilt angle of 45 degrees. For nitrogen (N), an implant voltage of 18 keV, a dose of 1E14 ions/cms and 1E15 ions/cm2, and a wafer tilt angle of 45 degrees.

All scientific and technical terms used herein have meanings commonly used in the art unless otherwise specified. The definitions provided herein are to facilitate understanding of certain terms used frequently herein and are not meant to limit the scope of the present disclosure.

As used in this specification and the appended claims, "top" and "bottom" (or other terms like "upper" and "lower") are utilized strictly for relative descriptions and do not imply any overall orientation of the article in which the described element is located.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise. The term "and/or" means one or all of the listed elements or a combination of any two or more of the listed elements.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising" and the like. For example, a conductive trace that "comprises" silver may be a conductive trace that "consists of" silver or that "consists essentially of" silver.

As used herein, "consisting essentially of," as it relates to a composition, apparatus, system, method or the like, means that the components of the composition, apparatus, system, method or the like are limited to the enumerated components and any other components that do not materially affect the basic and novel characteristic(s) of the composition, apparatus, system, method or the like.

The words "preferred" and "preferably" refer to embodiments that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure, including the claims.

Also herein, the recitations of numerical ranges by endpoints include all numbers subsumed within that range (e.g., 1 to 5 includes 1, 1.5, 2, 2.75, 3, 3.80, 4, 5, etc. or 10 or less includes 10, 9.4, 7.6, 5, 4.3, 2.9, 1.62, 0.3, etc.). Where a range of values is "up to" a particular value, that value is included within the range.

Use of "first," "second," etc. in the description above and the claims that follow is not intended to necessarily indicate that the enumerated number of objects are present. For example, a "second" substrate is merely intended to differentiate from another infusion device (such as a "first" substrate). Use of "first," "second," etc. in the description above and the claims that follow is also not necessarily intended to indicate that one comes earlier in time than the other.

Thus, embodiments of devices including at least one adhesion layer are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation.

What is claimed is:

1. A method of forming a near field transducer (NFT) layer, the method comprising:
   depositing a film of a primary element, the film having a film thickness and a film expanse; and
   implanting at least one secondary element into the primary element,
   wherein the NFT layer comprises the film of the primary element doped with the at least one secondary element.

2. The method according to claim 1, wherein the at least one secondary element is implanted using beam line implanting, or plasma immersion implanting.

3. The method according to claim 1, wherein the concentration of the at least one secondary element is not constant across the thickness of the film.

4. The method according to claim 1, wherein the concentration of the at least one secondary element is not constant across the expanse of the film.

5. The method according to claim 1, wherein the at least one secondary element is implanted at more than one energy.

6. The method according to claim 1 further comprising annealing after implanting the at least one secondary element.

7. The method according to claim 6 further comprising depositing a metal or dielectric layer on the implanted film before annealing.

8. The method according to claim 6 further comprising implanting at least one secondary element after annealing.

9. The method according to claim 1 further comprising patterning the NFT layer into a NFT.

10. The method according to claim 1 further comprising depositing a metal or dielectric layer on the film of primary element before implanting the at least one secondary element.

11. A method of forming a peg of a near field transducer (NFT), the method comprising:
    depositing a primary element to form a primary element film or layer;
    defining a peg of the NFT from the primary element film or layer;
    forming the peg of the NFT;
    encapsulating the peg with an encapsulation layer;
    defining an implant; and
    implanting at least one secondary element in the implant area of the primary element film to form the peg of the NFT.

12. The method according to claim 11, wherein the step of defining the implant comprises using a mask so that only the implant area is exposed.

13. The method according to claim 11 further comprising annealing after implanting the at least one secondary element.

14. The method according to claim 13 further comprising at least one additional implanting step and at least one additional annealing step.

15. The method according to claim 11 further comprising removing at least a portion of the encapsulation layer after implanting the at least one secondary element.

16. The method according to claim 15 further comprising depositing a dielectric material after removing at least a portion of the encapsulation layer.

17. A method of forming a plurality of magnetic heads, each of the magnetic heads comprising an alloyed peg of a NFT, the method comprising:
    depositing a primary element on a substrate to form a primary element film or layer;
    forming a plurality of pegs of the NFTs;
    slicing the substrate into rows, each row containing a plurality of pegs;
    depositing head overcoat material on each row; and
    implanting at least one secondary element in the primary element film of the peg to form an alloyed peg of a NFT.

18. The method according to claim 17, wherein the step of implanting comprises using a mask so that only the implant area is exposed to the at least one secondary element.

19. The method according to claim 17 further comprising depositing additional head overcoat material after implanting the at least one secondary element.

* * * * *